United States Patent
Choi et al.

(10) Patent No.: US 7,894,499 B2
(45) Date of Patent: Feb. 22, 2011

(54) SEMICONDUCTOR LASER DEVICE WITH A ROUNDED BASE MESA STRUCTURE

(75) Inventors: Kwang-ki Choi, Gyeonggi-do (KR); Joon-seop Kwak, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 682 days.

(21) Appl. No.: 10/823,653

(22) Filed: Apr. 14, 2004

(65) Prior Publication Data

US 2004/0247006 A1 Dec. 9, 2004

(30) Foreign Application Priority Data

Jun. 3, 2003 (KR) ............... 10-2003-0035601

(51) Int. Cl.
*H01S 3/16* (2006.01)
*H01S 5/00* (2006.01)
(52) U.S. Cl. .............. 372/44.01; 372/41; 372/46.01
(58) Field of Classification Search .............. 372/41, 372/44.01, 46.01
See application file for complete search history.

(56) References Cited

U.S. PATENT DOCUMENTS

| | | | |
|---|---|---|---|
| 4,142,160 A | * | 2/1979 | Tsukada et al. .......... 372/46.01 |
| 4,476,563 A | * | 10/1984 | Van Ruyven ............ 372/46.01 |
| 5,966,396 A | * | 10/1999 | Okazaki et al. .......... 372/46.01 |
| 6,348,108 B1 | | 2/2002 | Yusa et al. |
| 6,444,486 B1 | | 9/2002 | Kwak et al. |
| 6,798,807 B2 | * | 9/2004 | Nakamura et al. ....... 372/43.01 |
| 2004/0264529 A1 | * | 12/2004 | Witzigmann et al. ......... 372/43 |

FOREIGN PATENT DOCUMENTS

| | | |
|---|---|---|
| CN | 1360377 A | 7/2002 |
| JP | 10-093140 | 4/1998 |
| JP | 2000-058965 | 2/2000 |
| JP | 2001-015865 | 1/2001 |

OTHER PUBLICATIONS

Official Action issued by the Chinese Patent Office in corresponding Chinese Patent Application No. 200410038474.1 on Dec. 8, 2006.

* cited by examiner

*Primary Examiner*—Armando Rodriguez
(74) *Attorney, Agent, or Firm*—Cantor Colburn LLP

(57) ABSTRACT

A semiconductor laser device having a smooth cleavage plane is provided. The provided laser device includes a current injection ridge and force distribution ridges formed adjacent to the current injection ridge, which protrudes from an upper surface of a mesa structure. The mesa structure is formed of multi-semiconductor material layers including a laser resonance layer and cladding layers disposed above and below the resonance layer. The current injection ridge and the force distribution ridges distribute a scribing force when cleaving the laser device so that the smooth cleavage planes are obtained. Defects are prevented in the current injection ridge due to the distribution of force when bonding flip chips.

14 Claims, 6 Drawing Sheets

FIG. 1
Conventional
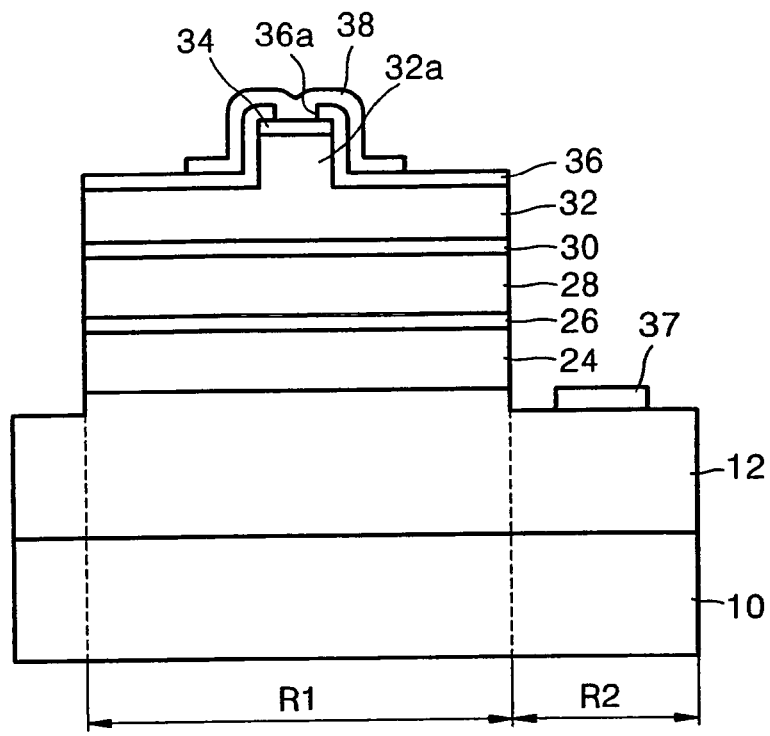
FIG. 2
Conventional
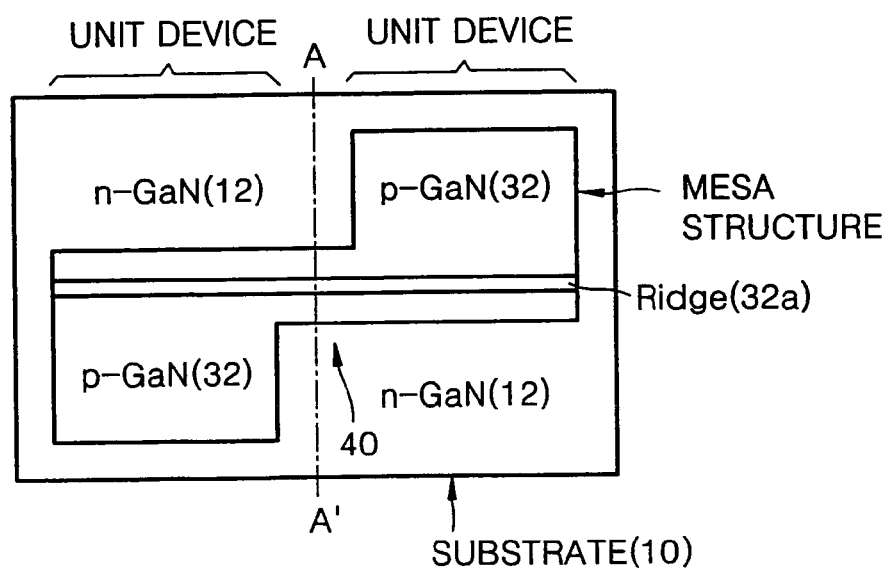

FIG. 3
Conventional
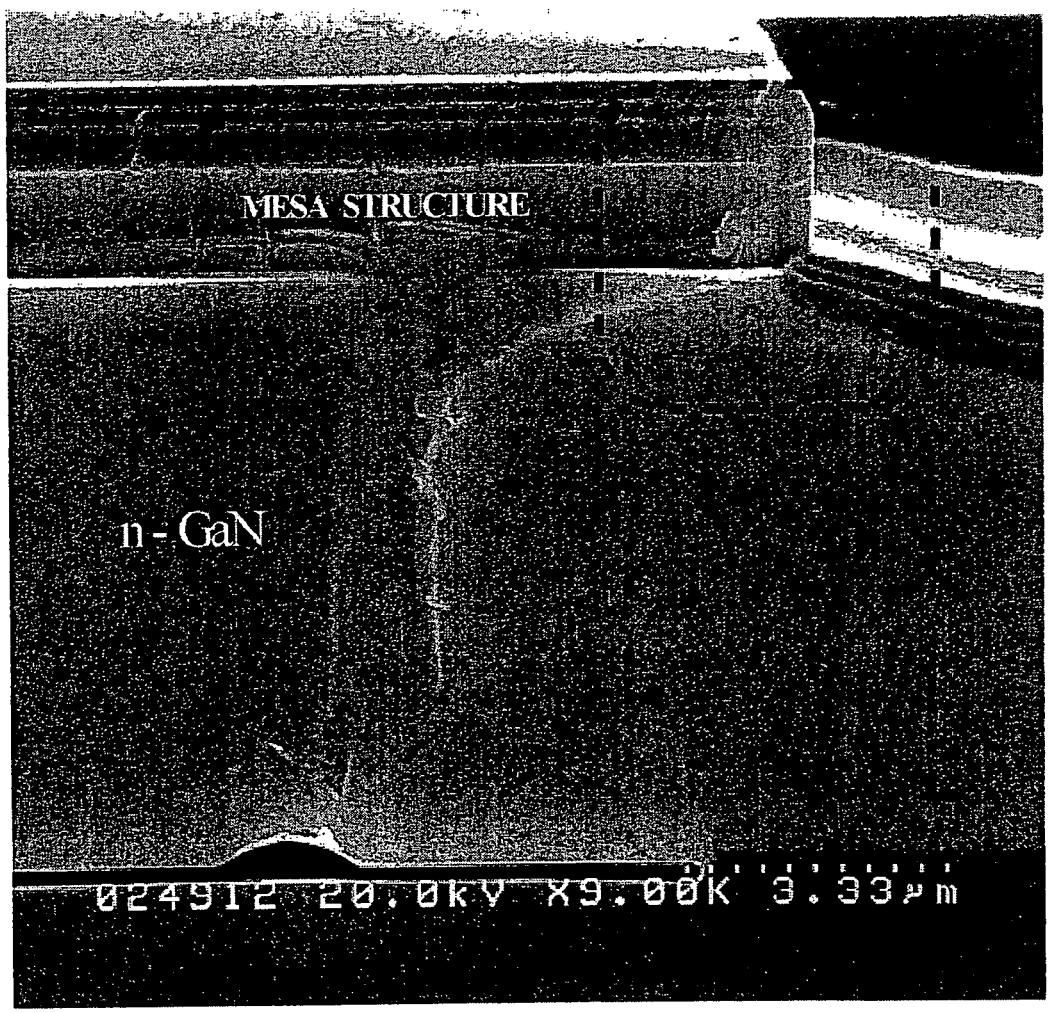

FIG. 4
Conventional
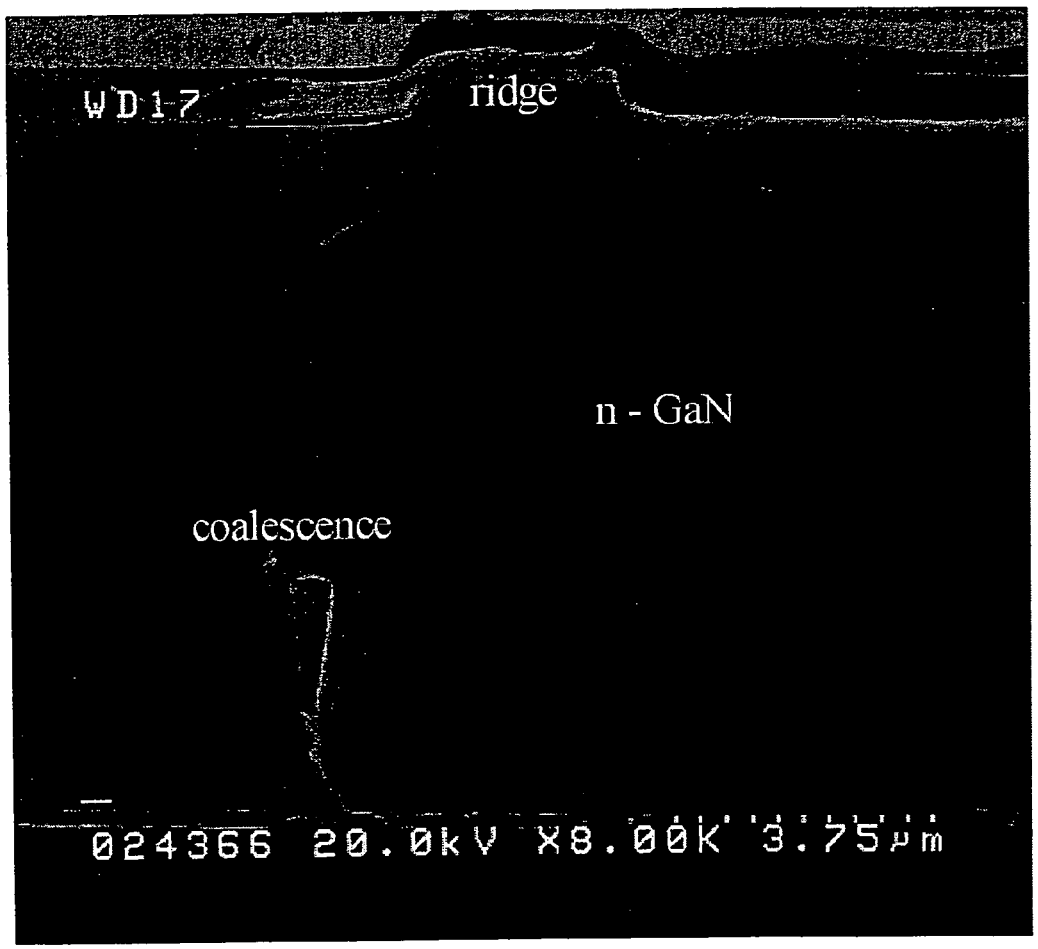

SEMICONDUCTOR LASER DEVICE WITH A ROUNDED BASE MESA STRUCTURE

BACKGROUND OF THE DISCLOSURE

This application claims the priority of Korean Patent Application No. 2003-35601, filed on Jun. 3, 2003, in the Korean Intellectual Property Office, the disclosure of which is incorporated herein in its entirety by reference.

1. Field of the Disclosure

The present disclosures relates to a semiconductor laser device, and more particularly, to a laser device having a smooth cleavage plane.

2. Description of the Related Art

A semiconductor laser is widely used to transfer, record, and read data in the field of communications, such as optical communications, or in devices, such as a compact disk player (CDP) and a digital versatile disk player (DVDP).

Since a semiconductor laser device may maintain oscillation characteristics of laser beam in a limited space, may be formed to a small scale, and requires a small critical current for laser oscillations, the semiconductor laser device is widely used. As the number of industrial fields to which the semiconductor laser is applied increases, demand for semiconductor laser devices having a smaller critical current increases. In other words, semiconductor laser devices having excellent characteristics, such as oscillating at a low current, and the ability to pass a lifespan test are needed.

In order to decrease the operating power and increase the output of the laser device, a smooth light-exiting surface, through which light exits the laser device, perpendicular to a laser oscillation layer is required. The light-exiting surface, which is formed by etching or scribing, is referred to as a facet or a cleavage plane.

When the light-exiting surface is formed by dry etching, the light-exiting surface is rough, resulting in a large optical loss and low reproducibility. However, when the cleavage plane is formed by scribing, the optical loss is reduced. A nitride semiconductor laser device, such as gallium nitride (GaN) uses the cleavage plane as the light-exiting surface. However, the crystal structures of GaN grown on a sapphire substrate and the sapphire substrate are different so that it is technically difficult to form a smooth cleavage plane and the yield is low.

FIG. 1 is a sectional view of a conventional nitride semiconductor laser device.

Referring to FIG. 1, an n-GaN lower contact layer 12, which is divided into a first region R1 and a second region R2, is stacked on a sapphire substrate 10. A multi-layered semiconductor material layer with a mesa structure exists on the lower contact layer 12. In other words, on the first region R1, an n-GaN/AlGaN lower cladding layer 24, an n-GaN lower wave guide layer 26, a InGaN active layer 28, a p-GaN upper wave guide layer 30, and a p-GaN/AlGaN upper cladding layer 32 are sequentially stacked on the n-GaN lower contact layer 12. The refractive indexes of the n-GaN/AlGaN lower cladding layer 24 and the p-GaN/AlGaN upper cladding layer 32 are smaller than the refractive indexes of the n-GaN lower wave guide layer 26 and the p-GaN upper wave guide layer 30. In addition, the refractive indexes of the n-GaN lower wave guide layer 26 and the p-GaN upper wave guide layer 30 are smaller than the refractive index of the active layer 28. In the mesa structure, a protruding ridge 32a having a predetermined width is formed at the center of the upper portion of the p-GaN/AlGN upper cladding layer 32, providing a ridge wave guide structure, and a p-GaN upper contact layer 34 is formed on the ridge 32a. A buried layer 36, which acts as a passivation layer having a contact hole 36a is formed on the p-GaN/AlGaN upper cladding layer 32. The contact hole 36a of the buried layer 36 is located over the upper contact layer 34 that is formed on the ridge 32a, and edge of the contact hole 36a overlaps the edge of the upper surface of the upper contact layer 34.

A p-type upper electrode 38 is formed on the buried layer 36. The p-type electrode 38 contacts the upper contact layer 34 through the contact hole 36a of the buried layer 36. In the second region R2, an n-type lower electrode 37 is formed on the lower contact layer 12, whose height is lower in the second region R2 than in the first region R1.

The ridge wave guide structure formed on the upper cladding layer 32 limits currents that are injected to the active layer 28 in order to limit a width of a resonance area for laser oscillation in the active layer 28. Thus, a transverse mode is stabilized and the operating current is lowered.

In the process of manufacturing the conventional nitride semiconductor laser device, the multi-layered GaN semiconductor material layer is formed on the sapphire substrate, and the ridge corresponding to a current injection area is formed by dry etching. Then, a mesa structure is formed on the n-GaN lower contact layer in order to expose the n-GaN lower contact layer and form the resonance surface. Such a mesa structure is formed as an array type on the sapphire substrate, and is then divided into unit devices by scribing. FIG. 2 is a plane view illustrating two mesa structures corresponding to two unit devices that are formed on the n-GaN contact layer 12. The mesa structures are interconnected by a connection unit 40 and share the ridge 32a, which crosses the connection unit 40. The mesa structures and the substrate, which supports the mesa structures, are divided into the unit devices along a scribing line A-A' that intersects the connection unit 40.

As described above, the mesa structures are divided into the unit devices by scribing, and the cleavage planes from which a laser beam exits are formed at the edges resulting from the scribing. A GaN c-plane formed on a sapphire-c plane is tilted by about 30° toward the sapphire-c plane. Since the sapphire-c plane and the GaN c-plane are tilted, it is difficult to form a smooth cleavage plane perpendicular to the laser oscillation layer. In order to form the smooth cleavage planes perpendicular to the laser oscillation layer on the GaN semiconductor material layer, the cleavage plane of the sapphire substrate should be precisely divided by scribing. When the scribing force is transferred from the sapphire substrate to the lower portion of the mesa structure and the ridge at the upper portion of the mesa structure, the scribing force should not be concentrated at a specific location of the mesa structure, but should be evenly distributed.

The light-exiting surfaces, in other words, the cleavage planes, of the semiconductor material layer formed by the conventional method have little uniformity. In other words, the shapes of the cleavage planes are different from chip to chip even when the chips are manufactured under the same scribing conditions. The yield of laser devices proper for transmitting light, in other words, having the smooth cleavage plane perpendicular to the oscillation layer, is about 65%.

The following is an analysis of the laser device with the inferior light-exiting surface. When scribing the mesa structure by transferring the scribing force from the sapphire substrate to the mesa structure, the scribing force is concentrated at a lower corner of the mesa structure so that cracks occur at the lower corner of the mesa structure as shown in the dotted rectangle of FIG. 3. Here, the cracks are transferred to the light-exiting surface. Another inferior light-exiting surface is caused by cracks in a GaN coalescence formed by epitaxial lateral overgrowth (ELOG), which is disclosed in U.S. Pat.

No. 6,348,108. Referring to FIG. 4, when the scribing force is transferred from the sapphire substrate to the GaN, cracks occur at the GaN coalescence. The cracks are transferred to a ridge wave guide formed on the mesa structure as shown in the dotted rectangle of FIG. 4, so that a rough cleavage plane is formed.

The cracks and the rough cleavage plane result in a decrease in optical output and an increase in operating current.

SUMMARY OF THE DISCLOSURE

The present disclosure provides a laser device having an excellent laser exiting surface and a method of manufacturing the same.

The present invention disclosure also provides a semiconductor laser device having a low operating current and an improved laser oscillation efficiency, and a method of manufacturing the same.

According to an aspect of the present disclosure, there may be provided a semiconductor laser device, which includes a multi-semiconductor material layered mesa structure having a laser resonance layer on a substrate and cladding layers formed above and below the resonance layer, comprising a current injection ridge and force distribution ridges at the both sides of the current injection ridge formed on an upper portion of the mesa structure and protruding from the surface of an upper surface of the mesa structure.

According to another aspect of the present disclosure, there may be provided a semiconductor laser device, which includes a multi-semiconductor material layered mesa structure having a laser resonance layer on a substrate and cladding layers formed above and below the resonance layer, comprising rounded corners connected to the substrate, in a lower portion of the mesa structure, and a current injection ridge and force distribution ridges formed in an upper portion of the mesa structure and protruding from an upper surface of the mesa structure.

The upper and the lower cladding layers may be a p-GaN/AlGaN layer and an n-GaN/AlGaN layer, respectively.

The resonance layer may include a lower wave guide layer stacked on the lower cladding layer and having a greater refractive index than the lower cladding layer, an active layer stacked on the lower wave guide layer that generates a laser beam, and an upper wave guide layer stacked on the active layer.

The refractive indexes of the upper and the lower wave guide layers may be less than the refractive index of the active layer, and the upper and the lower wave guide layers may be GaN based group III-V compound semiconductor layers.

The active layer may be a semiconductor layer made of a GaN based group III-V nitride compound expressed as $In_xAl_yGa_{1-x-y}N$ where $0 \leq x \leq 1$, $0 \leq y \leq 1$, and $x+y \leq 1$. The ridges may be formed on the upper cladding layer, and a second compound semiconductor layer may be formed on the current injection ridge. The second compound semiconductor layer may be a p-GaN based group III-V nitride semiconductor layer.

The first compound semiconductor substrate further may include an n-type electrode on the upper surface, and the substrate may be a sapphire substrate having a GaN semiconductor material layer or a freestanding GaN substrate.

Both sides of the mesa structure may be inclined toward the substrate, and the width of the mesa structure may increase toward the substrate.

The force distribution ridges may be formed at the both edges of the mesa structure.

BRIEF DESCRIPTION OF THE DRAWINGS

The above aspects and advantages of the present disclosure will be described in detailed exemplary embodiments thereof with reference to the attached drawings in which:

FIG. 1 is a sectional view of a conventional semiconductor laser device;

FIG. 2 is a plane view of a substrate on which undivided unit laser devices are formed when manufacturing a conventional semiconductor laser device;

FIGS. 3 and 4 are scanning electron microscope (SEM) photographs illustrating irregular surfaces on a cleavage plane of a mesa structure of a conventional semiconductor laser device;

DETAILED DESCRIPTION OF THE PREFERRED EMBODIMENTS

The present invention will now be described more fully with reference to the accompanying drawings, in which a preferred embodiment of the invention is shown.

Figure 5:
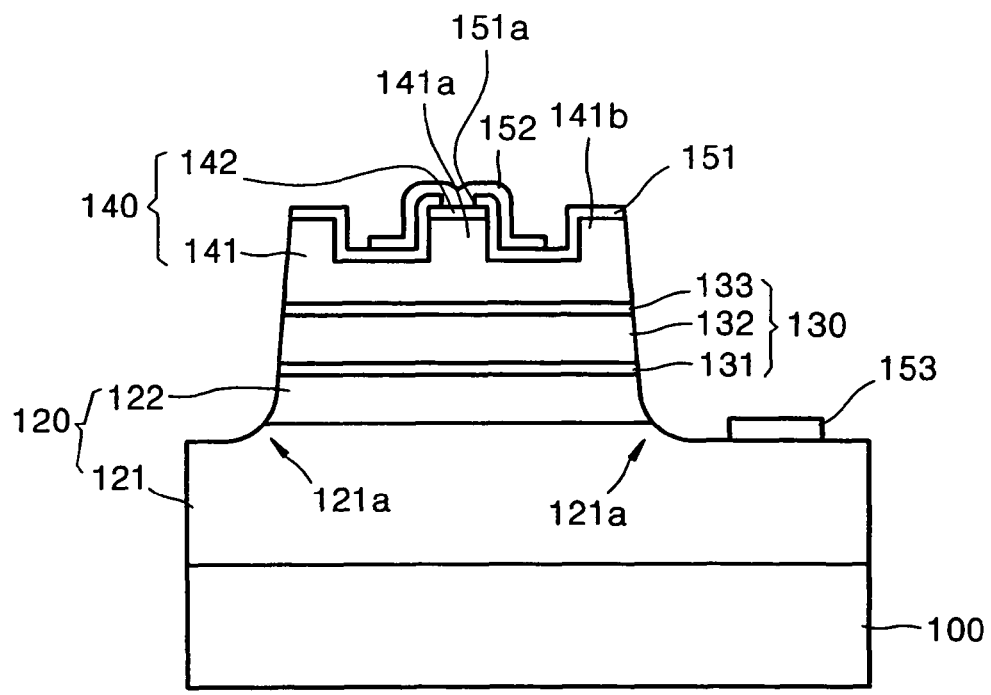
FIG. 5 is a sectional view illustrating a semiconductor laser device according to an embodiment of the present invention.
Figure 6:
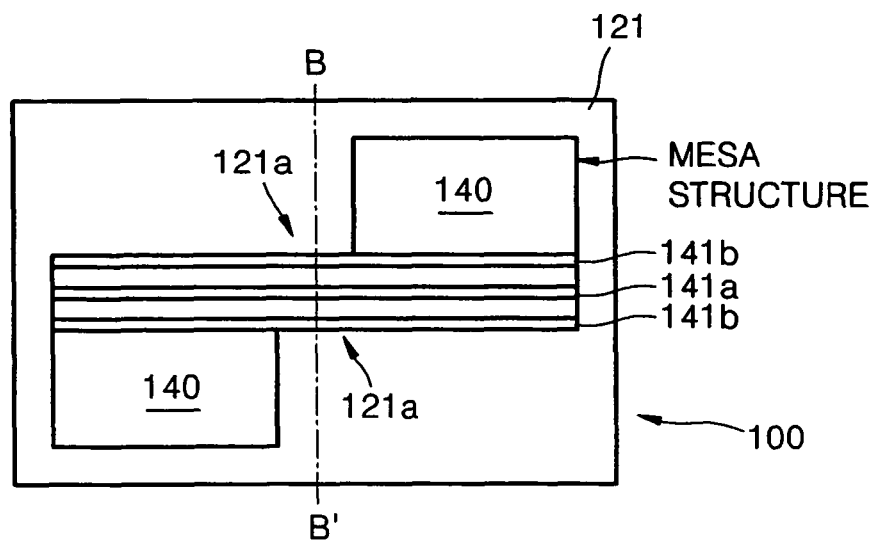
FIG. 6 is a plane view of a substrate on which undivided unit laser devices are formed when manufacturing a semiconductor laser device according to the embodiment of the present invention.

FIG. 5 is a sectional view of a semiconductor laser device according to an embodiment of the present invention. FIG. 6 is a plane view of an n-GaN contact layer 121 on which two mesa structures corresponding to two unit laser devices are formed. The semiconductor laser device includes a substrate 100, and a lower material layer 120, a resonance layer 130, and an upper material layer 140, which are grown on the substrate 100.

The lower material layer 120 includes a first compound semiconductor layer 121 as a lower contact layer, which is stacked on the substrate 100 and has a step, and a lower cladding layer 122 stacked on the first compound semiconductor layer 121. An n-type lower electrode 153 is disposed on the step of the first compound semiconductor layer 121.

A sapphire substrate or a freestanding gallium nitride (GaN) substrate is used for the substrate 100. The first compound semiconductor layer 121 is an n-GaN based group III-V nitride compound semiconductor layer, and it is preferable that the first compound semiconductor layer 121 is an n-GaN layer. However, the first compound semiconductor layer 121 may be another group III-V compound semiconductor layer that can oscillate laser, in other words, lasing. It is preferable that the lower cladding layer 122 is an n-GaN/AlGaN layer having a predetermined refractive index, but may be formed of another compound that can oscillate laser.

The resonance layer 130 includes a lower wave guide layer 131, an active layer 132, and an upper wave guide layer 133, which are sequentially stacked on the lower cladding layer 122. The upper and lower wave guide layers 131, 133 are formed of a material having a smaller refractive index than the active layer 132. It is preferable that the upper and lower wave guide layers 131 and 133 are GaN based group III-V compound semiconductor layers. The lower wave guide layer 131 is an n-GaN layer, and the upper wave guide layer 133 is a p-GaN layer. The active layer 132 is formed of a lasing material, preferably a material oscillating laser beam that has a small critical current and a stable traverse mode characteristic. It is preferable that the active layer 132 is formed of a GaN based group III-V nitride compound semiconductor material such as $In_xAl_yGa_{1-x-y}N$ ($0 \leq x \leq 1$, $0 \leq y \leq 1$, $x+y \leq 1$). The active layer 132 may have a multi-quantum well structure or a single quantum well structure, and the structure of the active layer 132 does not limit the scope of the present invention.

The upper material layer 140, includes an upper cladding layer 141 and a second compound semiconductor layer 142. The upper cladding layer 141 is stacked on the upper surface of the upper wave guide layer 133 and has a protruded current injection ridge 141a at its center and protruded force distribution ridges 141b adjacent to the current injection ridge 141a. The second compound semiconductor layer 142 acts as an ohmic contact layer and is stacked on the current injection ridge 141a. When the lower cladding layer 122 is an n-type compound semiconductor layer, the upper cladding layer 141 is a p-type compound semiconductor layer. When the lower cladding layer 122 is a p-type compound semiconductor layer, the upper cladding layer 141 is an n-type compound semiconductor layer. In other words, when the lower cladding layer 122 is the n-GaN/AlGaN layer, the upper cladding layer 141 is a p-GaN/AlGaN layer. Similarly, when the first compound semiconductor layer 121 is an n-type compound semiconductor layer, the second compound semiconductor layer 142 is a p-type compound semiconductor layer, and when the first compound semiconductor layer 121 is formed of n-GaN, the second compound semiconductor layer 142 is formed of p-GaN. A passivation layer 151 is formed on the ridges 141a and 141b. The passivation layer 151 includes a contact hole 151a that exposes the current injection ridge 141a, and a p-type upper electrode 152 is formed therein.

The mesa structure includes the resonance layer 130, the upper material layer 140, and the lower cladding layer 122 of the lower material layer 120. The lower portions of the mesa structure have rounded corners 121a. The rounded corners 121 a of the mesa structure prevent the concentration of a scribing force when dividing the unit devices along a line B-B' in FIG. 6.

It is preferable that the force distribution ridges 141b are parallel with the current injection ridge 141a and are symmetrical about the current injection ridge 141a. In addition, it is preferable that the width of each of the force distribution ridges 141b is equal to or greater than the width of the current injection ridge 141a. The force distribution ridges 141b prevent cracks in a GaN coalescence, which are caused by the scribing force, from being concentrated to the current injection ridge 141a. In other words, the cracks are vertically transferred in the mesa structure, and are not transferred to the current injection ridge 141a, and then, the light-exiting surface is not affected from the cracks.

Figure 7:
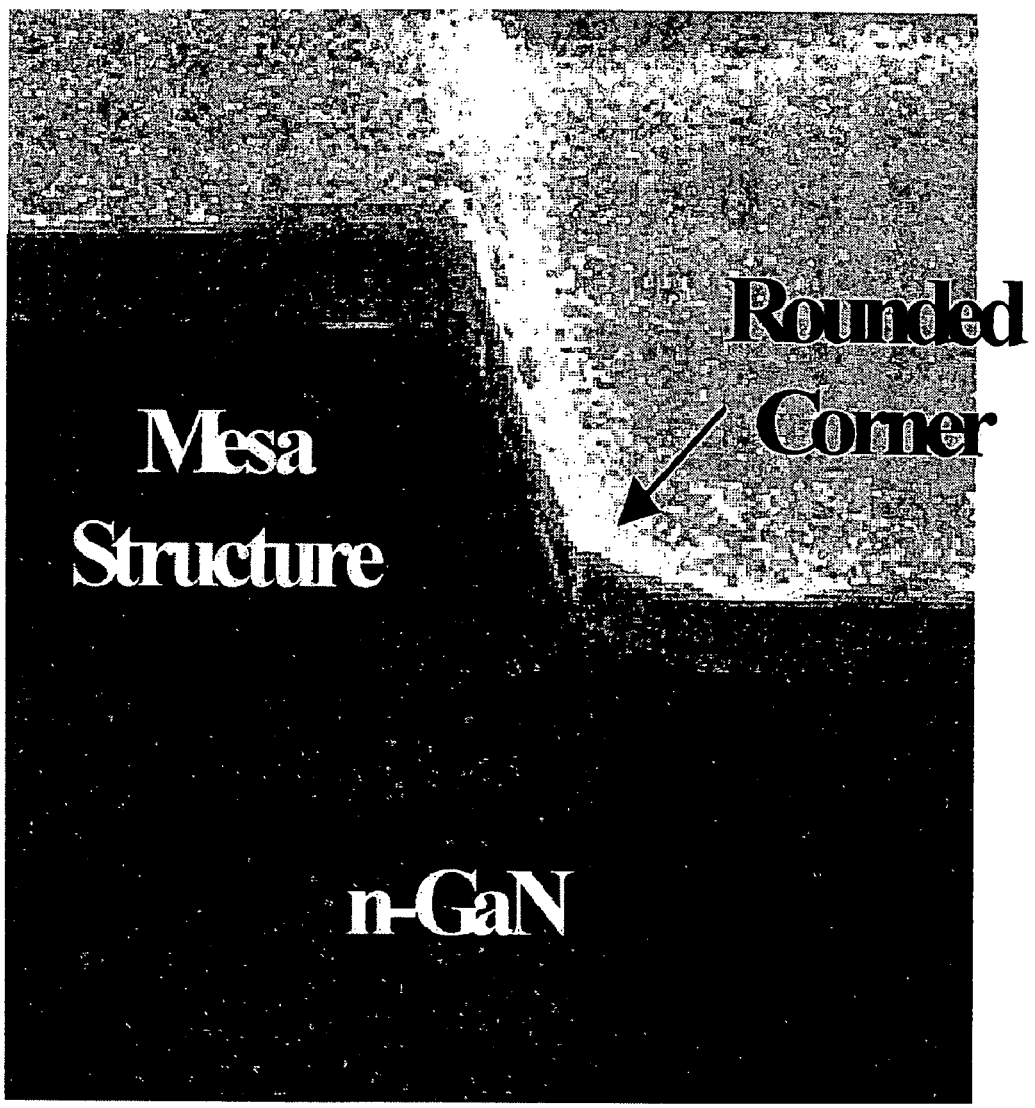
FIG. 7 is an SEM photograph illustrating a lower structure of a mesa structure of a semiconductor laser device according to the embodiment of the present invention.
Figure 8:
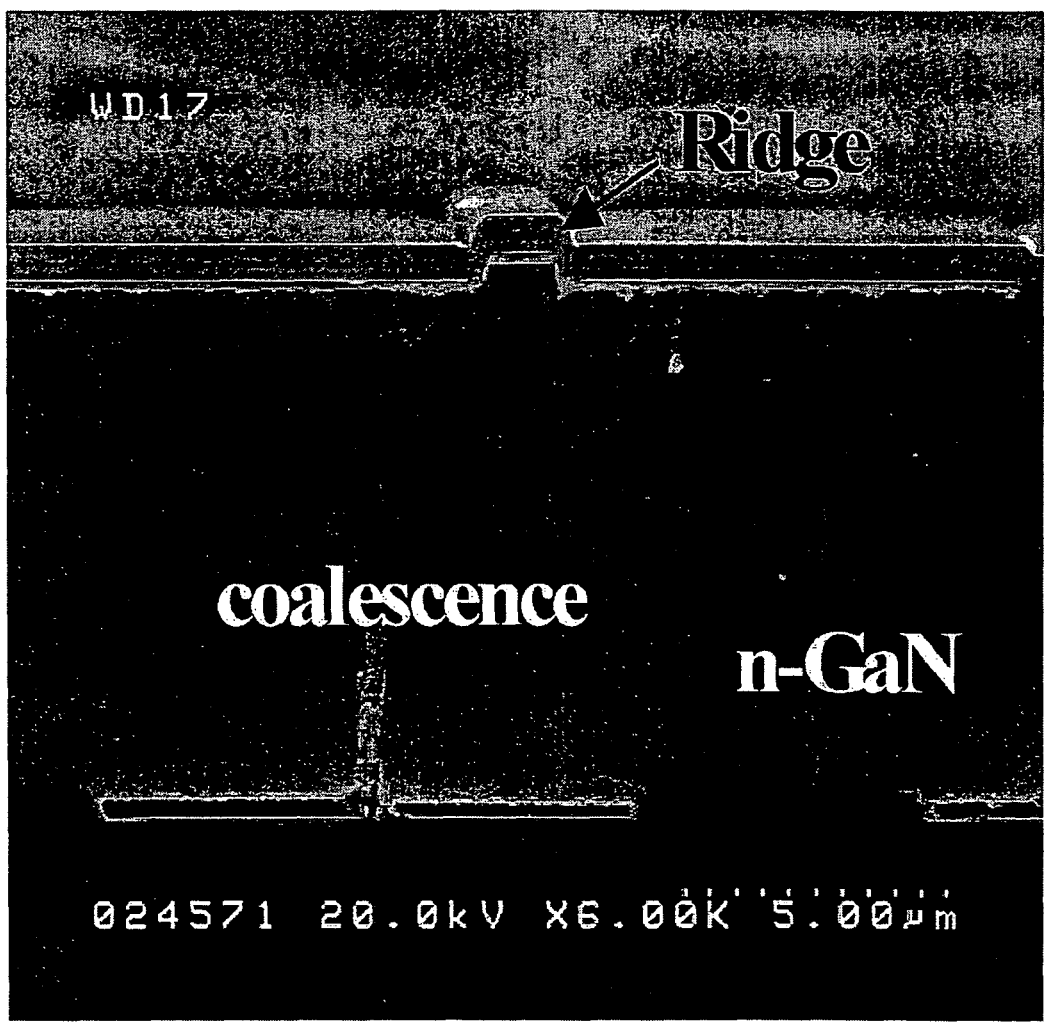
FIG. 8 is an SEM photograph illustrating a smooth cleavage plane formed on a mesa structure of a semiconductor laser device according to the embodiment of the present invention.

FIG. 7 is a scanning electron microscope (SEM) photograph illustrating the lower structure of the mesa structure of the semiconductor laser device according to the embodiment of the present invention, and FIG. 8 is an SEM photograph illustrating the current injection ridge 141a of the mesa structure.

Referring to FIG. 7, a smooth cleavage plane is formed at the rounded corner formed in the lower portion of the mesa structure, which contrasts the conventional cleavage plane shown in FIG. 3. Here, the smooth cleavage plane could be formed by not concentrating the cracks.

Referring to FIG. 8, since the current injection ridge is formed at the center of the mesa structure and the force distribution ridges are formed adjacent to the current injection ridge, the cracks of the coalescence are vertically transferred. Accordingly, the ridge has the smooth cleavage plane.

According to the embodiments of the present disclosure, rounded corners are formed in lower portions of a mesa structure, and force distribution ridges are disposed adjacent to a current injection ridge in an upper portion of the mesa structure. Accordingly, a smooth cleavage plane perpendicular to the oscillation surface is obtained by scribing, with a high yield. Because of the smooth cleavage plane, the laser oscillation efficiency is improved and the operating current of the laser device is lowered. The force distribution ridge may also distribute a load applied to the current injection ridge when bonding flip chips.

Such a laser device can be applied to a laser diode, in particular, a GaN laser diode having a mesa structure. While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor laser device, which includes a multi-semiconductor material layered mesa structure having a laser resonance layer on a substrate and cladding layers formed over and below the resonance layer, comprising:
    rounded corners connected to the substrate, in a lower portion of the mesa structure and configured to prevent concentration of a scribing force;
    a current injection ridge formed on an upper portion of the mesa structure and protruding from an upper surface of the mesa structure; and
    a passivation layer formed on the mesa structure and having a contact hole exposing an upper surface of the current injection ridge, wherein the upper and the lower cladding layers are a p-GaN/AlGaN layer and an n-GaN/AlGaN layer, respectively.

2. A semiconductor laser device, which includes a multi-semiconductor material layered mesa structure having a laser resonance layer on a substrate and cladding layers formed over and below the resonance layer, comprising:
    rounded corners connected to the substrate, in a lower portion of the mesa structure and configured to prevent concentration of a scribing force;
    a current injection ridge formed on an upper portion of the mesa structure and protruding from an upper surface of the mesa structure; and
    a passivation layer formed on the mesa structure and having a contact hole exposing an upper surface of the current injection ridge, wherein the upper and the lower cladding layers are a p-GaN/AlGaN layer and an n-GaN/AlGaN layer, respectively; wherein the resonance layer includes: a lower wave guide layer stacked on the lower cladding layer and having a greater refractive index than the lower cladding layer;
    an active layer stacked on the lower wave guide layer that generates a laser beam; and an upper wave guide layer stacked on the active layer.

3. The semiconductor laser device of claim 2, where the refractive indexes of the upper and the lower wave guide layers are less than the refractive index of the active layer and the upper and lower wave guide layers are GaN based group III-V compound semiconductor layers.

4. The semiconductor laser device of claim 2, wherein the active layer is a semiconductor layer made of a GaN based group III-V nitride compound expressed as $In_xAl_yGa_{1-x-y}N$ where $0 \leq x \leq 1$, $0 \leq y \leq 1$, and $x+y \leq 1$.

5. The semiconductor laser device of claim 2, wherein the ridge is formed on the upper cladding layer, and a second compound semiconductor layer is formed on the current injection ridge.

6. The semiconductor laser device of claim 5, wherein the second compound semiconductor layer is a p-GaN based group III-V nitride semiconductor layer.

7. The semiconductor laser device of claim 2, wherein the substrate further includes an n-type electrode on the upper surface, and the substrate is a sapphire substrate having a gallium nitride (GaN) semiconductor material layer or a freestanding GaN substrate.

8. A semiconductor laser device, which includes a multi-semiconductor material layered mesa structure having a laser resonance layer on a substrate and cladding layers formed above and below the resonance layer, comprising:
  rounded corners connected to the substrate, in a lower portion of the mesa structure and configured to prevent concentration of a scribing force;
  a current injection ridge and force distribution ridges formed on an upper portion of the mesa structure and protruding from an upper surface of the mesa structure; and a passivation layer formed on the mesa structure and having a contact hole exposing an upper surface of the current injection ridge, wherein the upper and the lower cladding layers are a p-GaN/AlGaN layer and an n-GaN/AlGaN layer, respectively.

9. A semiconductor laser device, which includes a multi-semiconductor material layered mesa structure having a laser resonance layer on a substrate and cladding layers formed over and below the resonance layer, comprising:
  rounded corners connected to the substrate, in a lower portion of the mesa structure and configured to prevent concentration of a scribing force;
  a current injection ridge formed on an upper portion of the mesa structure and protruding from an upper surface of the mesa structure; and
  a passivation layer formed on the mesa structure and having a contact hole exposing an upper surface of the current injection ridge, wherein the upper and the lower cladding layers are a p-GaN/AlGaN layer and an n-GaN/AlGaN layer, respectively wherein the resonance layer includes:
  a lower wave guide layer stacked on the lower cladding layer and having a greater refractive index than the lower cladding layer;
  an active layer stacked on the lower wave guide layer that generates a laser beam; and an upper wave guide layer stacked on the active layer.

10. The semiconductor laser device of claim 9, where the refractive indexes of the upper and the lower wave guide layers are less than the refractive index of the active layer and the upper and the lower wave guide layers are GaN based group III-V compound semiconductor layers.

11. The semiconductor laser device of claim 9, wherein the active layer is a semiconductor layer made of a GaN based group II-V nitride compound expressed as $In_xAl_yGa_{1-x-y}N$ where $0 \leq x \leq 1$, $0 \leq y \leq 1$, and $x+y \leq 1$.

12. The semiconductor laser device of claim 9, wherein the ridges are formed on the upper cladding layer, and a second compound semiconductor layer is formed on the central ridge.

13. The semiconductor laser device of claim 12, wherein the second compound semiconductor layer is a p-GaN based group III-V nitride semiconductor layer.

14. The semiconductor laser device of claim 9, wherein the substrate further includes an n-type electrode on the upper surface, and the substrate is a sapphire substrate having a GaN semiconductor material layer or a freestanding GaN substrate.

* * * * *